(12) United States Patent
Chang (10) Patent No.: US 6,737,324 B2
(45) Date of Patent: May 18, 2004

(54) METHOD FOR FABRICATING RAISED SOURCE/DRAIN OF SEMICONDUCTOR DEVICE

(75) Inventor: Kent Kuohua Chang, Taipei (TW)

(73) Assignee: Macronix, International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,561

(22) Filed: Jul. 26, 2002

(65) Prior Publication Data
US 2004/0002194 A1 Jan. 1, 2004

(30) Foreign Application Priority Data
Jul. 1, 2002 (TW) ........................................ 91114489 A (51) Int. Cl.[7] .......................... H01L 21/336; H01L 21/76
(52) U.S. Cl. ........................ 438/300; 438/303; 438/416; 438/418
(58) Field of Search ................................ 438/416, 216, 438/312, 357, 197, 280, 287, 223, 261, 300, 303, 418

(56) References Cited

U.S. PATENT DOCUMENTS

| | | | | |
|---|---|---|---|---|
| 5,281,552 A | * | 1/1994 | King et al. | 438/301 |
| 5,403,434 A | * | 4/1995 | Moslehi | 438/710 |
| 6,406,973 B1 | * | 6/2002 | Lee | 438/416 |
| 6,426,265 B1 | * | 7/2002 | Chu et al. | 438/312 |
| 6,492,216 B1 | * | 12/2002 | Yeo et al. | 438/197 |

* cited by examiner

*Primary Examiner*—John F. Niebling
*Assistant Examiner*—Walter L Lindsay, Jr.
(74) *Attorney, Agent, or Firm*—Jiang Chyun IP Office (57) ABSTRACT

A method for fabricating a raised source/drain of a semiconductor device is described. A gate structure is formed on a substrate, and then a source/drain with a shallow-junction is formed in the substrate beside the gate structure. A spacer is formed on the sidewalls of the gate structure. Thereafter, an elevated layer is formed on the gate structure and the source/drain with a shallow junction, wherein the elevated layer formed on the source/drain serves as an elevated source/drain layer.

28 Claims, 6 Drawing Sheets

METHOD FOR FABRICATING RAISED SOURCE/DRAIN OF SEMICONDUCTOR DEVICE

CROSS REFERENCE TO RELATED APPLICATIONS

This application claims the priority benefit of Taiwan application serial no. 91114489, filed Jul. 01, 2002.

BACKGROUND OF INVENTION

1. Field of Invention

The present invention relates to a method for fabricating a semiconductor device.

More particularly, the present invention relates to a method for fabricating a raised source/drain of a semiconductor device.

2. Description of Related Art

Except a gate oxide layer and a gate structure, a metal-oxide-semiconductor (MOS) device also comprises a source/drain region in the substrate beside the gate structure. The source/drain region has a conductivity type different from that of the substrate. In the field of VLSI, MOS devices are widely used in various circuits, such as logical circuits and memory circuits, and are essential for the devices.

Figure 1A:
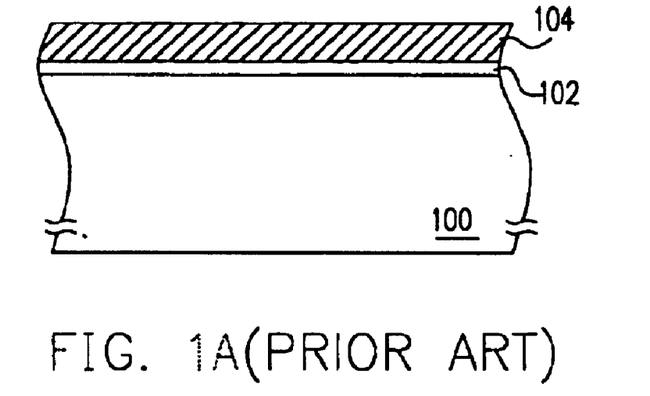
FIGS. 1A~1C illustrate a process flow of fabricating a MOS device in the prior art in a cross-sectional view.
Figure 1B:
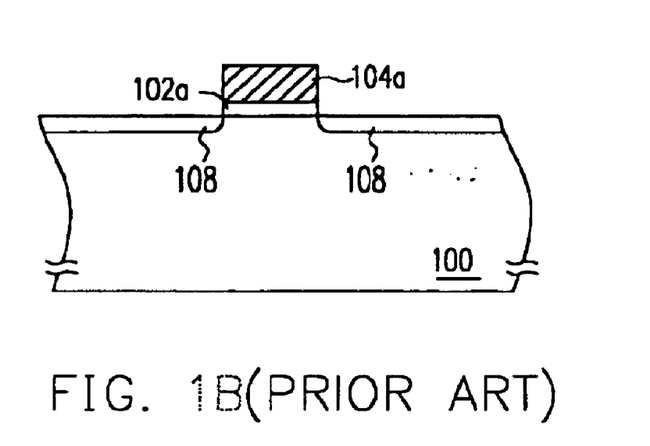
Figure 1C:
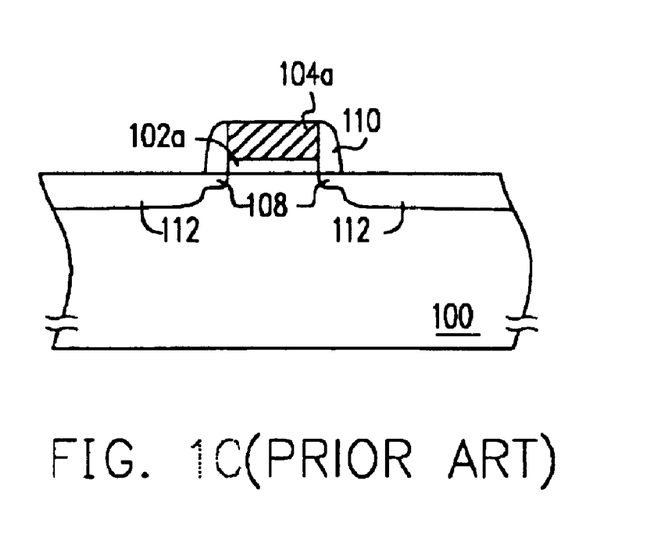

Refer to FIGS. 1A~1C, which illustrate a process flow of fabricating a MOS device in the prior art in a cross-sectional view.

Refer to FIG. 1A, a substrate 100 is provided. Then, a thin oxide layer 102 and a polysilicon layer 104 are sequentially formed on the substrate 100.

Refer to FIG. 1B, the polysilicon layer 104 and the thin oxide layer 102 are patterned to form a gate conductive layer 104a and a gate oxide layer 102a, respectively. An implantation is then performed to form a source/drain extension 108 in the substrate 100 beside the gate conductive layer 104a by using 104a as a mask.

Refer to FIG. 1C, a spacer 110 is formed on the sidewalls of the gate conductive layer 104a. An implantation is performed to form a source/drain 112 in the substrate 100 beside the spacer 110 with the gate conductive layer 104a and the spacer 110 as a mask.

The area of the source/drain region in a semiconductor device must be reduced as the device is miniaturized for higher integration. However, the miniaturization of the source/drain region increases the resistance, so the device current is decreased to cause overloading. The overloading problem can be solved by increasing the junction depth of the source/drain, but such a method results in the short channel effect and junction leakage. On the other hand, the source/drain can be formed with a shallow junction and a high dopant concentration, instead of a deeper junction, to prevent overloading, short channel effect and junction leakage simultaneously. However, the high-concentration strategy is usually not effective in preventing overloading because of the restriction of the solid state solubility. Furthermore, a method is provided in the prior art that decreases the spacer width and forms a shallow junction to prevent overloading and short channel effect. Unfortunately, the metal silicide layer on the source/drain with a shallow junction may cause unacceptable junction leakage.

SUMMARY OF INVENTION

Accordingly, this invention provides a method for fabricating a raised of a semiconductor device to lower the resistance of the source/drain.

This invention also provides a method for fabricating a raised source/drain of a semiconductor device to makes it feasible to form a source/drain with a shallow junction, so as to prevent the short channel effect and junction leakage.

A method for fabricating a raised source/drain of a semiconductor device of this invention is described as follows. A gate structure that comprises a gate oxide layer and a gate conductive layer is formed on a substrate. A low-energy implantation is used to form a source/drain with a shallow-junction in the substrate beside the gate structure, wherein the implanting energy is, for example, 2~3 KeV. Thereafter, a spacer is formed on the sidewalls of the gate structure. An elevated SiGe layer is formed on the gate structure and the source/drain with a shallow junction, wherein the SiGe layer on the source/drain serves as a raised source/drain of the device. The elevated SiGe layer is formed with rapid thermal chemical vapor deposition (RTCVD) using a reaction gas of $Si_2H_6/GeH_4$ mixture or $SiH_2Cl_2/GeH_4$ mixture. An implantation is performed to dope the elevated SiGe layer with P-type ions or N-type ions, and then a rapid thermal process (RTP) is conducted to anneal the elevated SiGe layer. A metal silicide layer is formed on the elevated SiGe layer to lower the resistance of the device.

Another method for fabricating a raised source/drain of a semiconductor device of this invention is described as follows. A gate structure that comprises a gate oxide layer, a gate conductive layer and a capping layer thereon is formed on a substrate. A low-energy implantation is used to form a source/drain with a shallow-junction in the substrate beside the gate structure, wherein the implanting energy is, for example, 2~3 KeV. Thereafter, a spacer is formed on the sidewalls of the gate structure. An elevated SiGe layer is formed on the source/drain with a shallow junction, wherein the SiGe layer on the source/drain serves as a raised source/drain of the device. The elevated SiGe layer is formed with rapid thermal chemical vapor deposition (RTCVD) using a reaction gas of $Si_2H_6/GeH_4$ mixture or $SiH_2Cl_2/GeH_4$ mixture. An implantation is performed to dope the elevated SiGe layer with P-type ions or N-type ions, and then a rapid thermal process (RTP) is conducted to anneal the elevated SiGe layer. A metal silicide layer is formed on the elevated SiGe layer to lower the resistance of the device. In this method, the capping layer and the spacer may comprise the same material or different materials. If the capping layer and the spacer comprise different materials, the metal silicide layer can be formed on both the gate conductive layer and the elevated SiGe layer after the capping layer is selectively removed.

Since an elevated SiGe layer is formed on the source/drain with a shallow junction in this invention, the resistance of the source/drain can be lowered effectively. Therefore, the source/drain can be formed with a shallower junction to prevent the short channel effect and junction leakage.

Moreover, by using the method for fabricating a raised source/drain of a semiconductor device of this invention, the reliability of junction contact of the source/drain and even the reliability of the whole device can be improved.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

First Embodiment

Refer to FIGS. 2A~2F, which illustrate a process flow of fabricating a MOS device according to the first embodiment of this invention in a cross-sectional view.

Figure 2A:
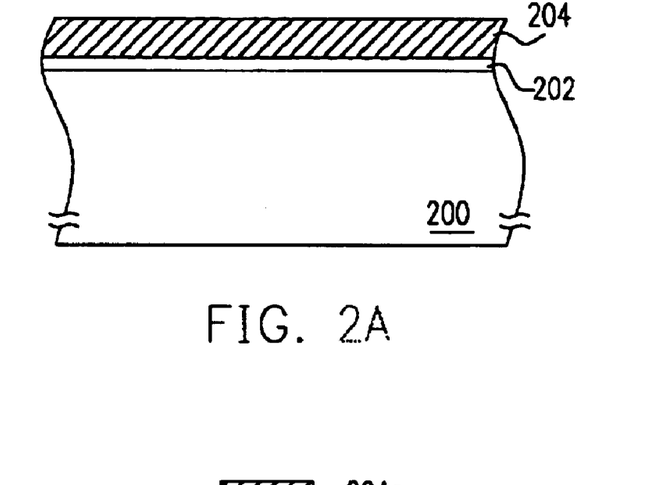
FIGS. 2A~2F illustrate a process flow of fabricating a MOS device according to a first embodiment of this invention in a cross-sectional view.

Refer to FIG. 2A, a thin oxide layer 202 and a conductive layer 204 are sequentially formed on a substrate 200, wherein the conductive layer 204 comprises, for example, polysilicon or other suitable conductive materials.

Figure 2B:
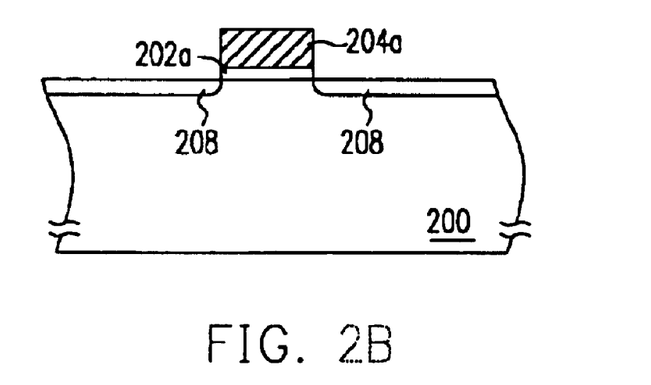

Refer to FIG. 2B, a lithography process and an etching process are performed to pattern the conductive layer 204 and the thin oxide layer 202 into a gate conductive layer 204a and a gate oxide layer 202a, respectively, which two constitute a gate structure. A low-energy implantation is used to form a source/drain 208 with a shallow-junction in the substrate 200 beside the gate structure, wherein the implanting energy is, for example, 2~3 KeV. For a P-type MOSFET, the implanted ions are, for example, boron or $BF_2^+$ ions. For an N-type MOSFET, the implanted ions are, for example, phosphorous or arsenic ions.

Figure 2C:
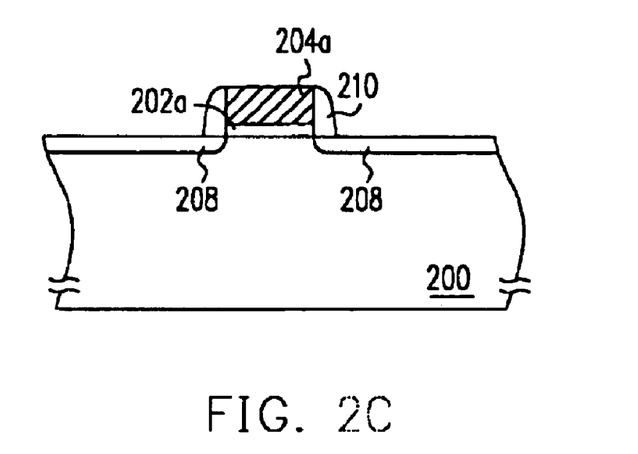

Refer to FIG. 2C, a spacer 210 is formed on the sidewalls of the gate structure by, for example, performing low-pressure chemical vapor deposition (LPCVD) and then an anisotropic etching process. In detail, a conformal dielectric layer is formed on the substrate 200 with LPCVD and then etched back anisotropically to form the spacer 210. The spacer 210 comprises silicon nitride or silicon oxide.

Figure 2D:
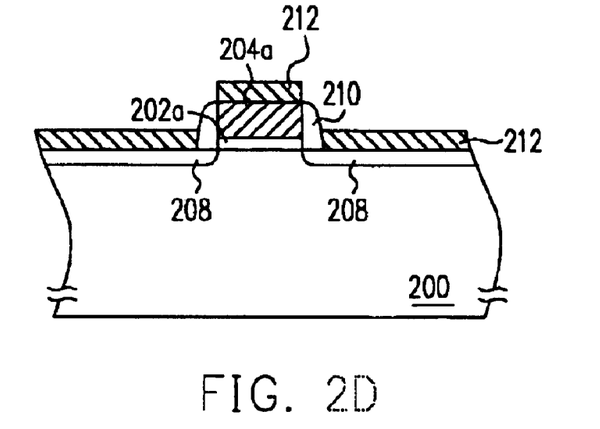

Refer to FIG. 2D, an elevated SiGe layer 212 is formed on the gate conductive layer 204a and the source/drain 208 with a shallow junction to lower the resistance of the gate conductive layer 204a and the source/drain 208. The elevated SiGe layer 212 on the source/drain 208 serves as a raised source/drain of the device. The thickness of the elevated SiGe layer 212 is, for example, 200~500 Å. The method for forming the elevated SiGe layer 212 is, for example, rapid thermal chemical vapor deposition (RTCVD) that uses a reaction gas such as $Si_2H_6/GeH_4$ mixture gas or $SiH_2Cl_2/GeH_4$ mixture gas. In addition, the RTCVD process is conducted under a pressure such as 1~20 Torr and a temperature such as 500° C.

Figure 2E:
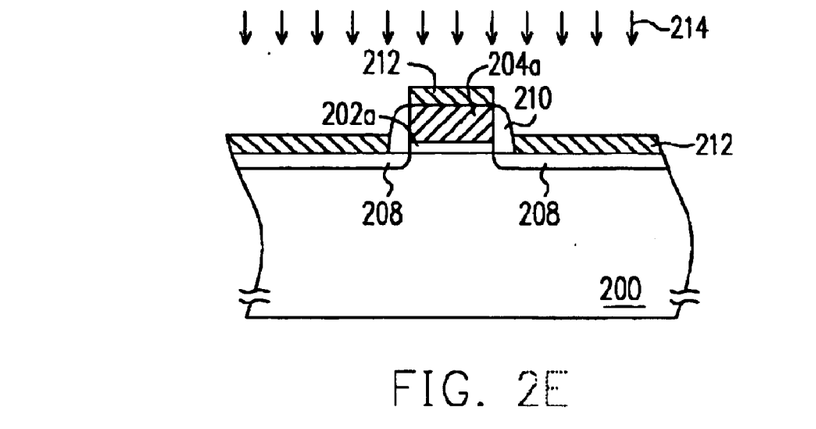

Refer to FIG. 2E, an ion implantation 214 is performed to dope the elevated SiGe layer 212 with P-type ions or N-type ions. A rapid thermal process (RTP) is then conducted to anneal the elevated SiGe layer 212 to create a required dopant profile.

It is noted that the implanted dopants, particularly boron, can be held in the elevated SiGe layer 212 and will not diffuse into other layers in subsequent thermal processes. Moreover, the resistance of the SiGe layer 212 is lower than that of the source/drain region 208, and the Ge concentration in the SiGe layer 212 can be adjusted to decrease the band gap of SiGe and thereby lower the resistance.

Therefore, the source/drain 208 can be formed with a shallower junction to avoid the short channel effect and junction leakage. Consequently, the reliability of junction contact of the source/drain and even the reliability of the whole device can be improved.

Figure 2F:
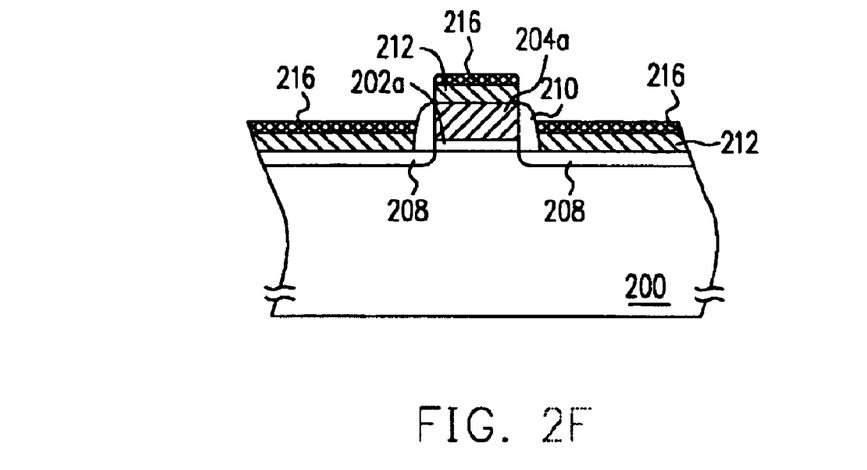

Refer to FIG. 2F, a metal silicide layer 216 is formed on the elevated SiGe layer 212 covering the gate conductive layer 204a and the source/drain 208 to further reduce the resistance of the device. The method for forming the metal silicide layer 216 comprises, for example, forming a metal layer on the substrate 200, performing a thermal process to make the metal layer react with silicon to form a self-aligned silicide (salicide) layer, and then removing the unreacted metal layer. In this embodiment, the metal silicide layer 216 comprises, for example, cobalt silicide ($CoSi_x$) or nickel silicide ($NiSi_x$).

Second Embodiment

FIGS. 3A~3F illustrate a process flow of fabricating a MOS device according to the second embodiment of this invention in a cross-sectional view.

Figure 3A:
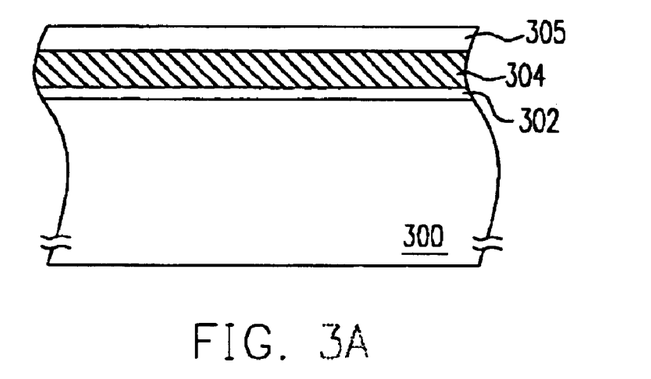
FIGS. 3A~3G illustrate a process flow of fabricating a MOS device according to a second embodiment of this invention in a cross-sectional view.

Refer to FIG. 3A, a thin oxide layer 302, a conductive layer 304 and a capping layer 305 are sequentially formed on a substrate 300. The conductive layer 304 comprises, for example, polysilicon or other suitable conductive materials. The capping layer 305 comprises a material such as TEOS or silicon nitride.

Figure 3B:
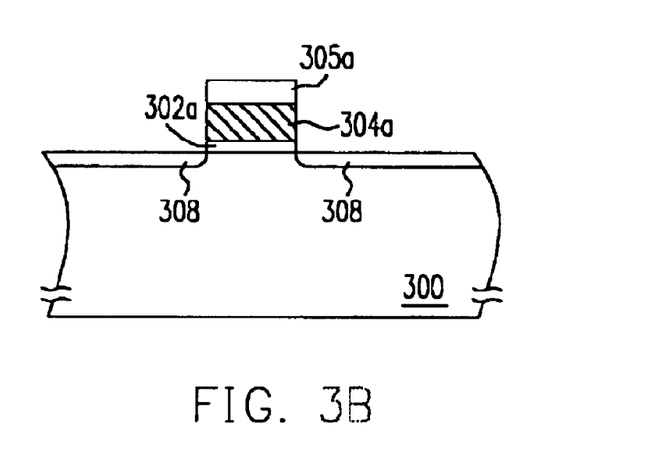

Refer to FIG. 3B, a lithography process and an etching process are performed to pattern the capping layer 305, the conductive layer 304 and the thin oxide layer 302 into a gate structure. The gate structure consists of a patterned capping layer 305a, a gate conductive layer 304a and a gate oxide layer 302a. A low-energy implantation is used to form a source/drain 308 with a shallow-junction in the substrate 300 beside the gate structure, wherein the implanting energy is, for example, 2~3 KeV. For a P-type MOSFET, the implanted ions are boron or $BF_2^+$ ions, for example. For an N-type MOSFET, the implanted ions are phosphorous or arsenic ions, for example.

Figure 3C:
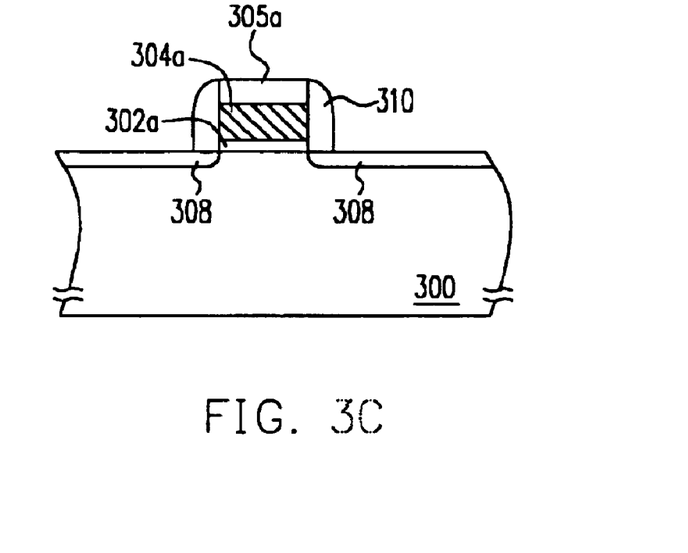

Refer to FIG. 3C, a spacer 310 is formed on the sidewalls of the gate structure by, for example, performing low-pressure chemical vapor deposition (LPCVD) and then an anisotropic etching process. In detail, a conformal dielectric layer is formed on the substrate 300 covering the capping layer 305a with LPCVD and then etched back anisotropically to form the spacer 310. The spacer 310 comprises silicon nitride.

Figure 3D:
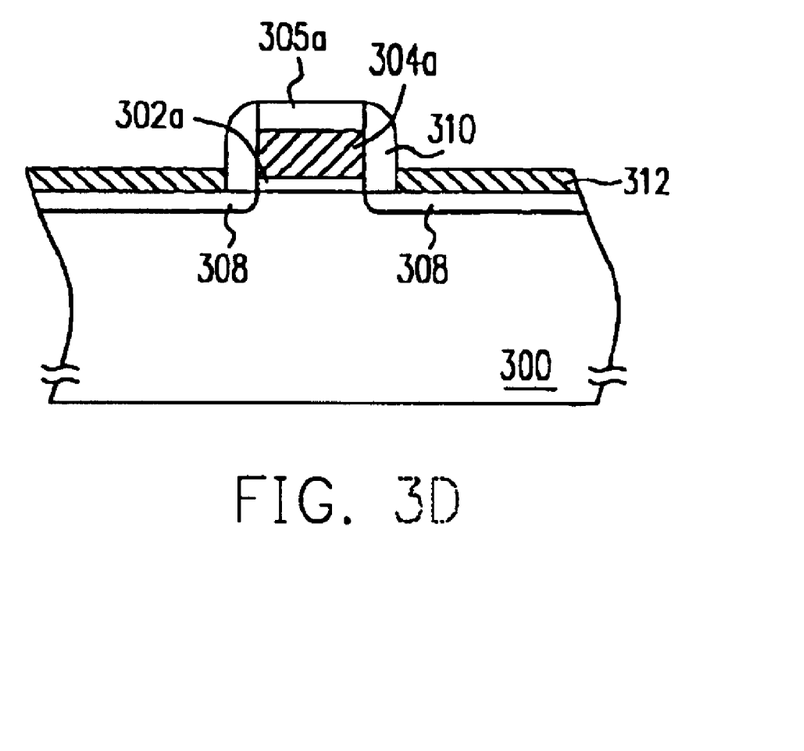

Refer to FIG. 3D, an elevated SiGe layer 312 is formed on the source/drain 308 with a shallow junction to lower the resistance of the source/drain 308. The thickness of the elevated SiGe layer 312 is, for example, 200~500 Å. The method for forming the elevated SiGe layer 312 is, for example, rapid thermal chemical vapor deposition (RTCVD) that uses a reaction gas such as $Si_2H_6/GeH_4$ mixture gas or $SiH_2Cl_2/GeH_4$ mixture gas. In addition, the RTCVD process is conducted under a pressure such as 1~20 Torr and a temperature such as 500° C.

Figure 3E:
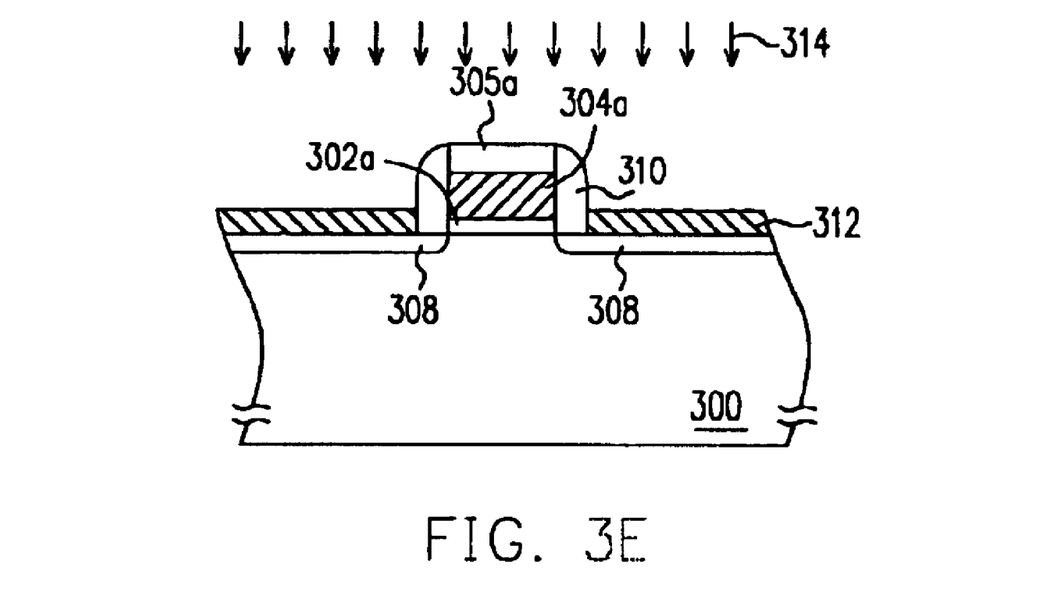

Refer to FIG. 3E, an ion implantation 314 is performed to dope the elevated SiGe layer 312 with P-type ions or N-type ions. A rapid thermal process is then conducted to anneal the elevated SiGe layer 312 to create a required doping profile.

It is noted that the implanted dopants, particularly boron, can be held in the elevated SiGe layer 312 and will not diffuse into other layers in subsequent thermal processes. Moreover, the resistance of the SiGe layer 312 is lower than that of the source/drain region 308, and the Ge concentration in the SiGe layer 312 can be adjusted to decrease the band gap of SiGe and thereby lower the resistance. Therefore, the source/drain 308 can be formed with a shallower junction to avoid the short channel effect and junction leakage. Consequently, the reliability of junction contact of the source/drain and even the reliability of the whole device can be improved.

Figure 3F:
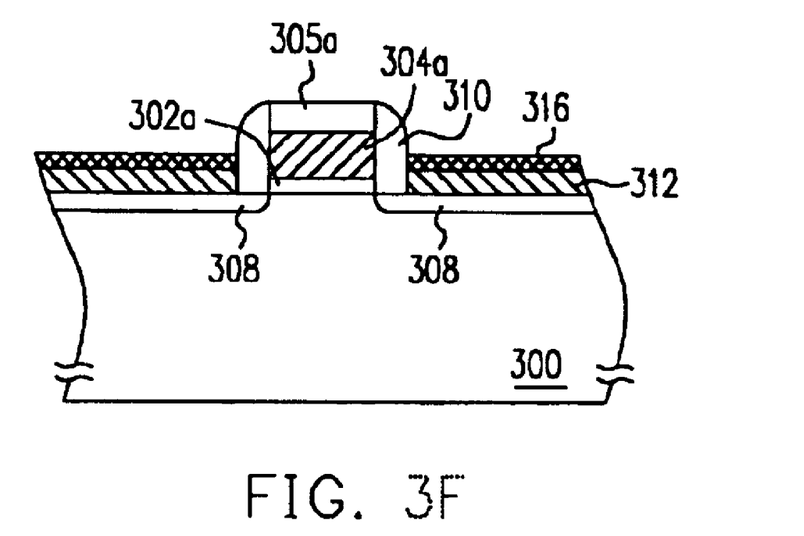

Refer to FIG. 3F, a metal silicide layer 316 is formed on the elevated SiGe layer 312 covering the source/drain 308 to further reduce the resistance of the device. The method for forming the metal silicide layer 316 comprises the following steps, for example. A metal layer is formed on the substrate 300 covering the gate conductive layer 304a, a thermal process is performed to make the metal layer react with silicon to form a self-aligned metal silicide (salicide) layer, and then the unreacted metal layer is removed. In this embodiment, the metal silicide layer 316 comprises, for example, cobalt silicide ($CoSi_x$) or nickel silicide ($NiSi_x$).

Figure 3G:
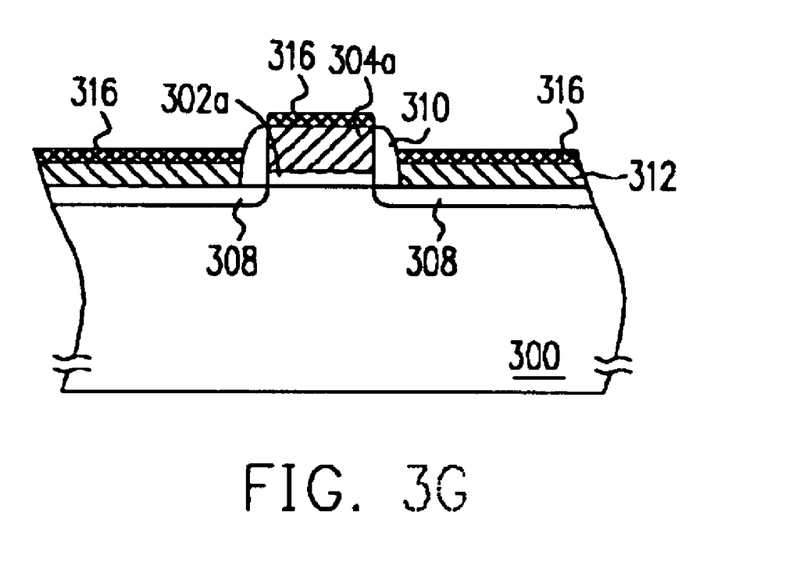

Besides, if the capping layer 305a and the spacer 310 comprise different materials, the metal silicide layer 316 can be formed on both the gate conductive layer 304a and the elevated SiGe layer 312 after the capping layer 305a is selectively removed, as shown in FIG. 3G. In this case, for example, the capping layer 305a comprises TEOS and the spacer 310 comprises silicon nitride, so the capping layer 305a can be selectively removed. Consequently, the resistance of the gate conductive layer 304a can also be reduced.

Since an elevated SiGe layer is formed on the source/drain with a shallow junction in this invention, the resistance of the source/drain can be lowered effectively. Therefore, the source/drain can be formed with a shallower junction to prevent the short channel effect and junction leakage.

Moreover, by using the method for fabricating a raised source/drain of a semiconductor device, the reliability of junction contact of the source/drain and even the reliability of the whole device can be improved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a raised source/drain of a semiconductor device, comprising:
    forming a gate structure on a substrate;
    forming a source/drain with a shallow-junction in the substrate beside the gate structure;
    forming a spacer on sidewalls of the gate structure; and
    forming an elevated SiGe layer on the gate structure and the source/drain with a shallow junction, wherein the elevated layer formed on the source/drain serves as an elevated source/drain layer.

2. The method of claim 1, wherein forming the elevated SiGe layer comprises performing rapid thermal chemical vapor deposition (RTCVD) to form the elevated SiGe layer.

3. The method of claim 2, wherein the RTCVD uses a reaction gas comprising $Si_2H_6/GeH_4$ mixture gas or $SiH_2Cl_2/GeH_4$ mixture gas.

4. The method of claim 2, wherein the RTCVD is conducted under 1~20 Torr and 500° C.

5. The method of claim 1, wherein a thickness of the elevated SiGe layer is 200~500 Å.

6. The method of claim 1, further comprising performing an implantation to dope the elevated SiGe layer.

7. The method of claim 1, further comprising forming a metal silicide layer on the elevated SiGe layer.

8. The method of claim 7, wherein the metal silicide layer comprises cobalt silicide ($CoSi_x$) or nickel silicide ($NiSi_x$).

9. A method for fabricating a raised source/drain of a semiconductor device, comprising:
    forming a gate structure on a substrate, the gate structure having a capping layer thereon;
    forming a source/drain with a shallow-junction in the substrate beside the gate structure, wherein an implanting energy for forming the source/drain with a shallow junction is 2~3 KeV;
    forming a spacer on sidewalls of the gate structure; and
    forming an elevated SiGe source/drain layer on the source/drain with a shallow junction.

10. The method of claim 9, wherein forming the elevated SiGe source/drain layer comprises performing rapid thermal chemical vapor deposition (RTCVD) to form the elevated source/drain layer.

11. The method of claim 10, wherein the RTCVD uses a reaction gas comprising $Si_2H_6/GeH_4$ mixture gas or $SiH_2Cl_2/GeH_4$ mixture gas.

12. The method of claim 10, wherein the RTCVD is conducted under 1~20 Torr and 500° C.

13. The method of claim 9, wherein a thickness of the elevated SiGe source/drain layer is 200~500 Å.

14. The method of claim 9, further comprising performing an implantation to dope the elevated SiGe source/drain layer.

15. The method of claim 9, further comprising forming a metal silicide layer on the elevated SiGe source/drain layer.

16. The method of claim 15, wherein the metal silicide layer comprises cobalt silicide ($CoSi_x$) or nickel silicide ($NiSi_x$).

17. The method of claim 9, wherein the capping layer and the spacer comprise the same material.

18. The method of claim 17, wherein the capping layer and the spacer both comprise silicon nitride.

19. A method for fabricating a raised source/drain of a semiconductor device, comprising:
    forming a gate structure on a substrate, the gate structure having a capping layer thereon;
    forming a source/drain with a shallow-junction in the substrate beside the gate structure;
    forming a spacer on sidewalls of the gate structure;
    forming an elevated SiGe source/drain layer on the source/drain with a shallow junction;
    removing the capping layer; and
    forming a metal silicide layer on the gate structure and the elevated SiGe source/drain layer.

20. The method of claim 19, wherein forming the elevated SiGe source/drain layer comprises performing rapid thermal chemical vapor deposition (RTCVD) to form the elevated source/drain layer.

21. The method of claim 20, wherein the RTCVD uses a reaction gas comprising $Si_2H_6/GeH_4$ mixture gas or $SiH_2Cl_2/GeH_4$ mixture gas.

22. The method of claim 20, wherein the RTCVD is conducted under 1~20 Torr and 500° C.

23. The method of claim 19, wherein a thickness of the elevated SiGe source/drain layer is 200~500 Å.

24. The method of claim 19, further comprising performing an implantation to dope the elevated SiGe source/drain layer.

25. The method of claim 19, wherein the metal silicide layer comprises cobalt silicide ($CoSi_x$) or nickel silicide ($NiSi_x$).

26. The method of claim 19, wherein an implanting energy for forming the source/drain with a shallow junction is 2~3 KeV.

27. The method of claim 19, wherein the capping layer and the spacer comprise different materials.

28. The method of claim 27, wherein the capping layer comprises silicon oxide and the spacer comprise silicon nitride.

* * * * *